United States Patent
Min (10) Patent No.: US 11,456,492 B2
(45) Date of Patent: Sep. 27, 2022

(54) BATTERY MANAGEMENT APPARATUS, VEHICLE HAVING THE SAME, AND METHOD OF CONTROLLING VEHICLE

(71) Applicants: HYUNDAI MOTOR COMPANY, Seoul (KR); KIA MOTORS CORPORATION, Seoul (KR)

(72) Inventor: Kyung In Min, Seongnam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 173 days.

(21) Appl. No.: 17/092,453

(22) Filed: Nov. 9, 2020

(65) Prior Publication Data

US 2021/0328270 A1 Oct. 21, 2021

(30) Foreign Application Priority Data

Apr. 21, 2020 (KR) .................. 10-2020-0048248

(51) Int. Cl.
| | |
|---|---|
| *H01M 10/42* | (2006.01) |
| *H01M 10/44* | (2006.01) |
| *G01R 31/396* | (2019.01) |
| *H01M 10/48* | (2006.01) |
| *G01R 31/392* | (2019.01) |
| *H02J 7/00* | (2006.01) |
| *B60L 58/10* | (2019.01) |

(52) U.S. Cl.
CPC .......... *H01M 10/425* (2013.01); *B60L 58/10* (2019.02); *G01R 31/392* (2019.01); *G01R 31/396* (2019.01); *H01M 10/441* (2013.01); *H01M 10/482* (2013.01); *H02J 7/007182* (2020.01); *B60L 2240/547* (2013.01); *H01M 2010/4278* (2013.01); *H01M 2220/20* (2013.01)

(58) Field of Classification Search
CPC ............ H01M 10/425; H01M 10/441; H01M 10/482; H01M 2010/4278; H01M 2220/20; G01R 31/392; G01R 31/396; B60L 58/10; B60L 2240/547; H02J 7/007182
USPC ...................................................... 320/127
See application file for complete search history.

(56) References Cited

U.S. PATENT DOCUMENTS 11,366,169 B2 * 6/2022 Ahn ..................... G01R 31/389
2017/0343613 A1 * 11/2017 Frost .................... G01R 31/367

\* cited by examiner

*Primary Examiner* — Nathaniel R Pelton
(74) *Attorney, Agent, or Firm* — Morgan, Lewis & Bockius LLP (57) ABSTRACT

The disclosure relates to a battery management apparatus, a vehicle having the same, and a method of controlling the vehicle. A method of controlling the vehicle having a motor, an engine, and a battery includes detecting respective voltage values of the plurality of cells provided in the battery; identifying a maximum voltage value and a minimum voltage value among the voltage values of the plurality of cells; obtaining a voltage deviation value between the identified maximum voltage value and the minimum voltage value; obtaining a deterioration rate of the battery; obtaining a power limit value of the battery based on at least one of the voltage deviation value or the deterioration rate of the battery; obtaining a final power limit value based on the obtained power limit value and a preset weight; and controlling a discharge of the battery based on the obtained final power limit value.

21 Claims, 6 Drawing Sheets

BATTERY MANAGEMENT APPARATUS, VEHICLE HAVING THE SAME, AND METHOD OF CONTROLLING VEHICLE

CROSS-REFERENCE TO RELATED APPLICATION(S)

The present application is based on and claims the benefit of priority to Korean Patent Application No. 10-2020-0048248, filed on Apr. 21, 2020 in the Korean Intellectual Property Office, the disclosure of which is incorporated by reference in its entirety.

TECHNICAL FIELD

The present disclosure relates to a battery management apparatus for preventing deterioration of a battery, a vehicle having the same, and a method of controlling the vehicle.

BACKGROUND

Vehicles control a start by using a battery, and when the start is complete, the vehicles include motor vehicles (internal combustion engine-driven cars) driven with mechanical power produced by burning fuel oil, such as gasoline and diesel, and eco-friendly vehicles driven by electrical power so as to reduce an amount of harmful fuel emissions and increase fuel efficiency.

The eco-friendly vehicles include electric vehicles having a rechargeable power supply comprised of the battery and a motor, rotating the motor with electricity charged in the battery, and driving the wheels using the rotation of the drive motor; hybrid vehicles having an engine, the battery, and the motor and driven by controlling the mechanical power of the engine and the electrical power of drive motor; and hydrogen fuel cell vehicles.

Unlike other mechanical parts, the battery of the eco-friendly vehicle has a feature of decreasing performance as it is used.

More particularly, the performance of many cells constituting the battery gradually deteriorates as a driving distance of the vehicle increases, and a voltage characteristic curve between each cell changes even if the same current is used when the performance decreases. At this time, an error in a state of charge (SOC) between each cell occurs, and due to this, the battery deteriorates rapidly, resulting in a problem that a life of the battery is shorter than expected.

Although the performance of the battery decreases, it does not mean that it cannot be used, but there is a problem that causes inconvenience to a user in relation to a driving of the vehicle.

The information disclosed in the Background section above is to aid in the understanding of the background of the present disclosure, and should not be taken as acknowledgement that this information forms any part of prior art.

SUMMARY

An aspect of the disclosure is to provide a battery management apparatus that adjusts a power limit value of a battery based on voltage values of a plurality of cells of the battery and a deterioration rate of the battery, a vehicle having the same, and a method of controlling the vehicle.

Another aspect of the disclosure is to provide a battery management apparatus that updates a weight for adjusting the power limit value based on the voltage values of the plurality of cells of the battery and adjusts a usage time of the battery based on the deterioration rate of the battery, a vehicle having the same, and a method of controlling the vehicle.

Additional aspects of the disclosure will be set forth in part in the description which follows and, in part, will be obvious from the description, or may be learned by practice of the disclosure.

In accordance with an aspect of the disclosure, a battery management apparatus includes a battery having a plurality of cells; a voltage detector configured to detect respective voltage values of the plurality of cells and to output voltage information about the detected voltage values; a storage configured to store a first map in which power limit values corresponding to voltage deviation values are matched; and a management controller configured to identify a maximum voltage value and a minimum voltage value among the voltage values of the plurality of cells, to obtain a voltage deviation value between the maximum voltage value and the minimum voltage value, to obtain a first power limit value of the battery corresponding to the voltage deviation value based on the first map, and to control discharging of the battery based on the first power limit value of the battery.

The battery management apparatus may further include a communicator configured to transmit the first power limit value of the battery to a vehicle controller in response to a control command of the management controller.

When the voltage deviation value exceeds a first reference value, the management controller may be configured to obtain a first final power limit value based on the first power limit value of the battery and a preset weight.

When controlling the discharge of the battery based on the first final power limit value, the management controller may be configured to identify the minimum voltage value among the voltage values of the plurality of cells, and to update the preset weight when the minimum voltage value is less than a second reference value.

When updating the preset weight, the management controller may be configured to update the preset weight based on a set value and a first predetermined ratio when the minimum voltage value is less than the second reference value and a value obtained by subtracting the second reference value from the minimum voltage value exceeds a third reference value, and to update the preset weight based on the set value and a second predetermined ratio when the subtracted value is less than or equal to the third reference value.

The storage may be configured to store a second map in which power limit values respectively corresponding to deterioration rates of the battery are matched. The management controller may be configured to obtain a deterioration rate of the battery when the voltage deviation value is less than or equal to a first reference value, to obtain a second power limit value corresponding to the deterioration rate of the battery based on the second map when the deterioration rate of the battery exceeds a reference deterioration rate, and to obtain a second final power limit value based on the second power limit value and a preset weight.

When controlling the discharge of the battery based on the second final power limit value, the management controller may be configured to identify the minimum voltage value among the voltage values of the plurality of cells, and to update the preset weight when the minimum voltage value is less than a second reference value.

When updating the preset weight, the management controller may be configured to update the preset weight based on a set value and a first predetermined ratio when the minimum voltage value is less than the second reference value and a value obtained by subtracting the second reference value from the minimum voltage value exceeds a third reference value, and to update the preset weight based on the set value and a second predetermined ratio when the subtracted value is less than or equal to the third reference value.

The storage may be configured to store a third map in which power limit values respectively corresponding to the voltage values of the battery are matched. When the voltage deviation value is less than or equal to the first reference value and the obtained deterioration rate of the battery is less than or equal to the reference deterioration rate, which is determined to be a normal state of the battery, the management controller may be configured to obtain a third power limit value corresponding to the normal state of the battery based on the third map, and to obtain a third final power limit value based on the third power limit value and the preset weight.

When controlling the discharge of the battery based on the third final power limit value, the management controller may be configured to identify the minimum voltage value among the voltage values of the plurality of cells, and to update the preset weight when the minimum voltage value is less than a second reference value.

When updating the preset weight, the management controller may be configured to update the preset weight based on a set value and a first predetermined ratio when the minimum voltage value is less than the second reference value and a value obtained by subtracting the second reference value from the minimum voltage value exceeds a third reference value, and to update the preset weight based on the set value and a second predetermined ratio when the subtracted value is less than or equal to the third reference value.

When the obtained deterioration rate of the battery exceeds the reference deterioration rate, the management controller may be configured to obtain an output reduction time corresponding to the deterioration rate of the battery, to obtain a current output available time of the battery based on a reference output available time and the output reduction time, and to control the discharge of the battery based on the current output available time.

In accordance with another aspect of the disclosure, a vehicle includes wheels using at least one of power of a motor and an engine as a driving power; a battery having a plurality of cells and configured to supply power to the motor; a voltage detector configured to detect respective voltage values of the plurality of cells and to output voltage information about the detected voltage values; a storage configured to store a first map in which power limit values corresponding to voltage deviation values are matched; a battery management apparatus including a processor configured to identify a maximum voltage value and a minimum voltage value among the voltage values of the plurality of cells, to obtain a voltage deviation value between the maximum voltage value and the minimum voltage value and a first power limit value of the battery corresponding to the voltage deviation value based on the first map, and to obtain a first final power limit value based on the first power limit value of the battery and a preset weight when the voltage deviation value exceeds a first reference value; and a controller configured to control an operation of at least one of the motor, the battery, or the engine, and to control discharge of the battery based on the first final power limit value obtained from the battery management apparatus.

The storage may be configured to store a second map in which power limit values respectively corresponding to deterioration rates of the battery are matched. The processor of battery management apparatus may be configured to obtain a deterioration rate of the battery when the obtained voltage deviation value is less than or equal to a first reference value, to obtain a second power limit value corresponding to the deterioration rate of the battery based on the second map when the deterioration rate of the battery exceeds a reference deterioration rate, and to obtain a second final power limit value based on the second power limit value and the preset weight.

The storage may be configured to store a third map in which power limit values respectively corresponding to the voltage values of the battery are matched. When the voltage deviation value is less than or equal to the first reference value and the deterioration rate of the battery is less than or equal to the reference deterioration rate, which is determined to be a normal state of the battery, the processor of battery management apparatus may be configured to obtain a third power limit corresponding to the normal state of the battery based on the third map, and to obtain a third final power limit value based on the third power limit value and the preset weight.

When controlling the discharge of the battery, the processor of battery management apparatus may be configured to identify the minimum voltage value among the voltage values of the plurality of cells, and to update the preset weight when the minimum voltage value is less than a second reference value.

When updating the preset weight, the processor of battery management apparatus may be configured to update the preset weight based on a set value and a first predetermined ratio when the minimum voltage value is less than the second reference value and a value obtained by subtracting the second reference value from the minimum voltage value exceeds a third reference value, and to update the preset weight based on the set value and a second predetermined ratio when the subtracted value is less than or equal to the third reference value.

When the obtained deterioration rate of the battery exceeds the reference deterioration rate, the processor of battery management apparatus may be configured to obtain an output reduction time corresponding to the deterioration rate of the battery, to obtain a current output available time of the battery based on a reference output available time and the output reduction time, and to transmit the current output available time to the controller.

In accordance with another aspect of the disclosure, in a method of controlling a vehicle, the vehicle including a motor, an engine, and a battery. The method includes detecting respective voltage values of the plurality of cells provided in the battery; identifying a maximum voltage value and a minimum voltage value among voltage values of the plurality of cells; obtaining a voltage deviation value between the identified maximum voltage value and the minimum voltage value; obtaining a deterioration rate of the battery; obtaining a power limit value of the battery based on at least one of the voltage deviation value or the deterioration rate of the battery; obtaining a final power limit value based on the power limit value and a preset weight; and controlling a discharge of the battery based on the final power limit value.

The obtaining of the power limit value of the battery may include, when the voltage deviation value exceeds a first reference value, obtaining the power limit value based on a first map in which power limit values corresponding to voltage deviation values are matched; when the voltage deviation value is less than or equal to the first reference value and the deterioration rate of the battery exceeds a reference deterioration rate, obtaining the power limit value based on a second map in which power limit values respectively corresponding to deterioration rates of the battery are matched; and when the voltage deviation value is less than or equal to the first reference value and the deterioration rate of the battery is less than or equal to the reference deterioration rate, obtaining the power limit value based on a third map in which power limit values respectively corresponding to the voltage values of the battery are matched.

The method may further include, when controlling the discharge of the battery, identifying the minimum voltage value among the voltage values of the plurality of cells, and updating the preset weight when the identified minimum voltage value is less than the second reference value.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Like reference numerals refer to like elements throughout the specification. Not all elements of the embodiments of the disclosure will be described, and the description of what are commonly known in the art or what overlap each other in the exemplary embodiments will be omitted. The terms as used throughout the specification, such as "~ part," "~module," "~ member," "~ block," etc., may be implemented in software and/or hardware, and a plurality of "~ parts," "~ modules," "~ members," or "~ blocks" may be implemented in a single element, or a single "~ part," "~ module," "~ member," or "~ block" may include a plurality of elements.

It will be further understood that the term "connect" and its derivatives refer both to direct and indirect connection, and the indirect connection includes a connection over a wireless communication network.

The terms "include (or including)" and "comprise (or comprising)" are inclusive or open-ended and do not exclude additional, unrecited elements or method steps, unless otherwise mentioned. It will be further understood that the term "member" and its derivatives refer both to when a member is in contact with another member and when another member exists between the two members.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

It is to be understood that the singular forms "a," "an," and "the" include plural references unless the context clearly dictates otherwise.

Reference numerals used for method steps are merely used for convenience of explanation, but not to limit an order of the steps. Thus, unless the context clearly dictates otherwise, the written order may be practiced otherwise.

Hereinafter, an operation principle and embodiments of the disclosure will be described with reference to accompanying drawings.

Figure 1:
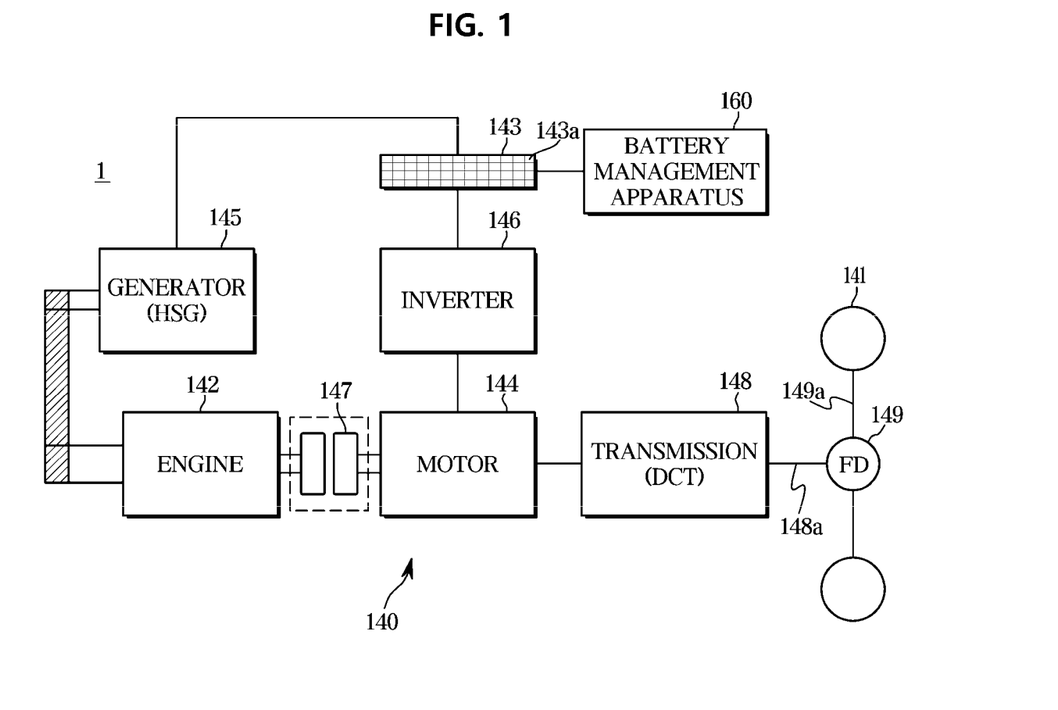
FIG. 1 is a view illustrating a chassis of a vehicle according to an exemplary embodiment of the present disclosure.

FIG. 1 is a view illustrating a chassis of a vehicle according to an exemplary embodiment of the present disclosure.

A vehicle 1 according to an embodiment is a hybrid vehicle driven by an engine, a battery, and a motor and controlling the mechanical power of the engine and the electrical power of the motor.

The vehicle may include a body with exterior and interior parts, and a chassis, which is other parts of the vehicle 1 except for the body, on which mechanical devices required for driving are installed.

Referring to FIG. 1, a power system 140 may include an engine 142, a fuel system, a cooling system, a refueling system, a battery 143, a motor 144, a generator 145, an inverter 146, a clutch 147, a transmission 148, and a final reduction and differential gear 149, and further include an actuator 147a for driving the clutch 147.

The engine 142 may burn fuel oil, such as gasoline and diesel to generate mechanical power, and transfer the power to the clutch 147.

The battery 143 may produce power with a high-tension current, and supply the power to the motor 144, the generator 145, and various kinds of electric devices in the vehicle.

The various electric devices in the vehicle may include a vehicle terminal, an audio device, and a lamp.

The battery 143 may be charged by receiving the power supplied from the generator 145.

The battery 143 may include a plurality of cells 143a.

The battery 143 may be managed by a battery management apparatus 160. The battery management apparatus 160 will be described later.

The battery 143 may include a battery capable of charging and discharging.

The number of batteries provided in the vehicle may be one or two.

For example, the vehicle may include a main battery that supplies a driving power to a power train including the motor 144, and an auxiliary battery that supplies the driving power to electronic devices such as convenience devices and additional devices.

The main battery may be charged using the power generated by the generator driven during regenerative braking, and the auxiliary battery may be charged using the power charged in the main battery.

The motor 144 may generate a turning force (also called rotation power) using electrical energy from the battery 143, and transmit the turning force to wheels 141 to drive the wheels 141.

Once connected to the engine 142 by the clutch 147, the motor 144 transmits its turning force along with the turning force of the engine 142 to the wheels 141. The motor 144 may also perform a function of absorbing a shock from closing of the clutch 147 while performing a function of a conventional torque converter.

In addition, the motor 144 may convert the electric energy of the battery 143 into mechanical energy for operating various electric devices provided in the vehicle.

The motor 144 may operate as a generator in a regenerative braking mode due to braking, deceleration, or low-speed driving, enabling the battery 143 to be charged.

The generator 145, e.g., a Hybrid Starter Generator (HSG), may be connected to a crank shaft of the engine 142, engaged with the crank shaft of the engine 142 and may operate as a starter motor when the engine 142 is started, and may operate as a generator by the engine 142 to enable the battery 143 to be charged when the wheels 141 are not driven by the engine 142.

In some exemplary embodiments, the generator 145 may act as the generator by the power transmitted through the engine 142, enabling the battery 143 to be charged.

The vehicle may also charge the battery 143 by receiving and using power from a charger located in a parking lot or a charging station.

The power system 140 of the vehicle may further include a power converter for converting the power generated by the generator 145 to rechargeable power for the battery 143 and converting the power of the battery 143 into the driving power of the generator 145. The power converter may be a converter.

The power converter may also perform a function to change the direction and output of a current between the generator 145 and the battery 143.

The inverter 146 may convert the power from the battery 143 to driving power for the motor 144.

The inverter 146 may output the driving power for the motor 144 based on a target speed from a user command. The driving power for the motor 144 may be a switching signal to output a current corresponding to the target speed and a switching signal to output a voltage corresponding to the target speed.

Accordingly, the inverter 146 may include a plurality of switching devices.

The clutch 147 may be arranged between the engine 142 and the motor 144.

The clutch 147 may be closed or locked when both the engine 142 and the motor 144 are used to generate driving power for the wheels 141, and may be opened by a spring pushed back by the hydraulic pressure produced by driving of the actuator, e.g., a Hydraulic Clutch Actuator (HCA), when the driving power for the wheels 141 is generated using only the motor 144.

That is, the clutch 147 may be in an open state or a closed state according to a driving mode of the vehicle.

More particularly, the clutch 147 may be opened when decelerating driving or low-speed driving is performed using the motor 144, and may be opened even when braking is performed. The clutch 147 may be closed when climbing driving. It accelerating driving and constant speed driving of a certain speed or more are performed, and may be closed when the battery 143 is in a protection mode.

The clutch 147 may be a normal close type clutch that connects the engine 142 and the motor 144 when the vehicle power is turned off.

The transmission 148 may transmit turning motions of the engine 142 and the motor 140 to the wheels 141, or transmit a turning motion of the motor 144 to the wheels 140.

The transmission 148 may be a Dual Clutch Transmission (DCT) that uses two clutches to manipulate a gear.

The transmission 148 automatically performs optimal torque conversion by enabling the gear to be automatically manipulated based on the driving speed of the vehicle.

The vehicle may further include the final reduction and differential gear (FD) 149 arranged between the transmission 148 and the wheels 141.

The FD may include a final reduction device and a differential gear.

The final reduction device may convert revolutions per minute (rpm) of the motor 144 so that the driving speed of the vehicle reaches the target speed. That is, the final reduction device may generate a driving force corresponding to the converted rpm of the motor 144 and transmit the generated driving force to the left and right wheels 141, respectively.

The final reduction device is also capable of converting the input rpm of the motor 144 into a certain ratio.

Here, the target speed may be a speed corresponding to pressurization of an accelerator pedal or a brake pedal.

This final reduction device may include a drive pinion and a ring gear, and may reduce a rotational speed and change a rotational direction to a right angle. That is, the final reduction device may increase the driving force by decelerating the speed between the transmission 148 and the wheels 141 again, and change a direction of power transmission at the same time.

In the final reduction device, the drive pinion may receive the turning force of a propulsion shaft 148a and change it to an angle close to the right angle, while simultaneously decelerating and transmitting it to the differential gear. The final reduction device may transmit the changed turning force of the propulsion shaft to a rear axle, and increase the turning force through the final deceleration.

The differential gear may rotate the left and right wheels 141 at different speeds.

That is, the differential gear may generate the driving force of the left and right wheels 141 by adjusting a transmission ratio of the transmission 148, and transmit the generated driving force to the left and right wheels 141, respectively.

In the embodiment, the power system 140 may have a parallel structure, in which both the engine 142 and the motor 144 are connected to an axle 149a of the vehicle to drive the vehicle at the same time.

In an electric vehicle (EV) mode where the vehicle is driven only by the motor 144, the vehicle opens the clutch 147 to prevent the motor 144 and the engine 142 from being mechanically connected in order to transmit the rotation of the motor 144 directly to the transmission 148. At this time, the engine 142 may be driven off, and may be driven on while the battery is being charged.

Furthermore, the vehicle closes the clutch 147 when driven by the operation of both the engine 142 and the motor 144 (in a hybrid electric vehicle (HEV) mode), in order for the turning force of the engine 142 to be added to the turning force of the motor 144 and then transmitted to the transmission 148.

Even while the vehicle is driven only by the engine 142, the vehicle closes the clutch 147 for the engine 142 to be rotated together with the motor 144 because the engine 142 needs to be connected to the axle 149a.

Figure 2:
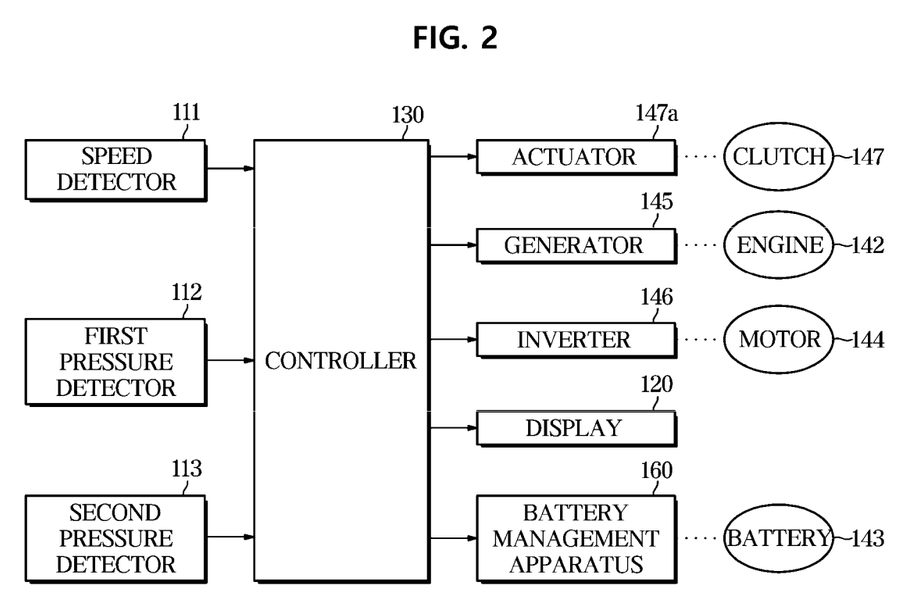
FIG. 2 is a control block diagram of a vehicle according to an exemplary embodiment of the present disclosure.
Figure 3:
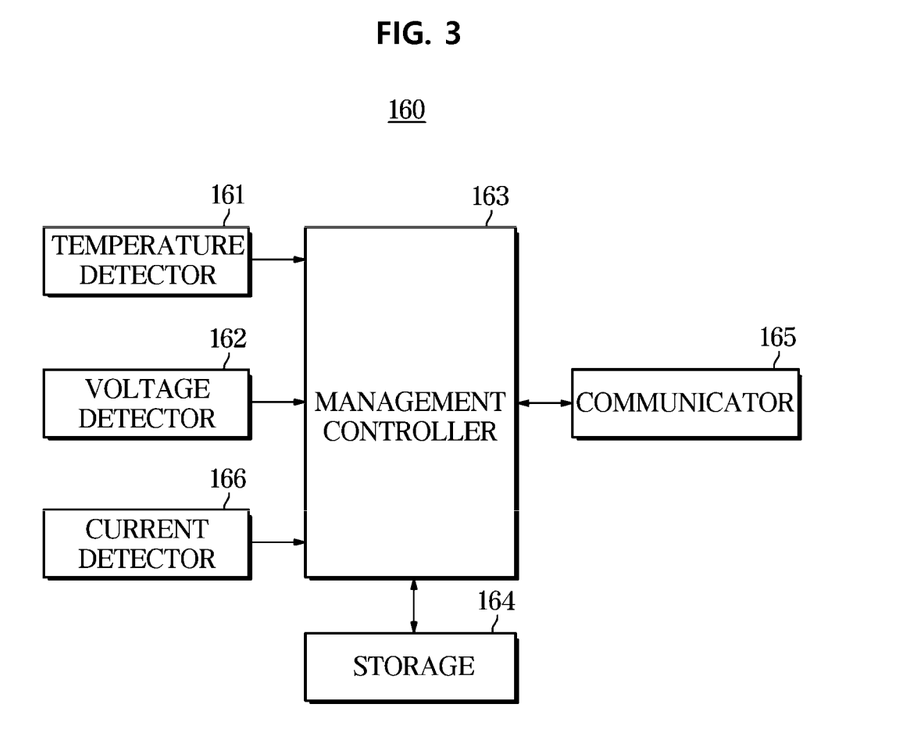
FIG. 3 is a control block diagram of a battery management apparatus illustrated in FIG. 2.

FIG. 2 is a control block diagram of a vehicle according to an exemplary embodiment of the disclosure, and FIG. 3 is a control block diagram of a battery management apparatus illustrated in FIG. 2.

Referring to FIG. 2, the vehicle may include a speed detector 111, a first pressure detector 112, a second pressure detector 113, a display 120, and a controller 130.

The vehicle may further include the battery management apparatus 160 that monitors a state of charge (SOC) and an abnormal state of the battery 143 and output state information for monitoring.

The speed detector 111 may detect the speed of the vehicle and output driving speed information about the detected speed.

The speed detector 111 may include a wheel speed sensor that is provided on each of the front, rear, left, and right wheels 111 to detect the rotational speed of each wheel 111, or may include an acceleration detector that detects an acceleration of the vehicle.

The first pressure detector 112 may detect a pressure applied to the accelerator pedal and output first pressure information about the detected pressure.

The second pressure detector 113 may detect a pressure applied to the brake pedal and output second pressure information about the detected pressure.

The first and second pressure detectors 112 and 113 may be a pressure sensor.

The display 120 may display the EV mode using only the power of the motor 144, and a HEV mode using the power of the engine 142 and the motor 144.

The display 120 may also display information about a low voltage state of the battery 143.

That is, the display 120 may display information about the abnormal state of the battery 143.

In addition, the display 120 may be a display provided in a head unit, a display provided in a cluster, or a display provided in a user interface.

The display 120 may be a lamp such as a light emitting diode (LED) separately provided inside the vehicle.

The controller 130 may obtain the user's required power based on the first pressure information or the second pressure information and the driving speed (i.e., vehicle speed) information, obtain the target driving speed of the vehicle corresponding to the obtained user's requested power, and control the operation of at least one of the engine 142 and the motor 144 based on the obtained target driving speed of the vehicle. Through this, the vehicle may be driven by the power generated by the at least one of the engine 142 and the motor 144.

The controller 130 may control the execution of the EV mode in which the vehicle is driven using only the power of the motor 144 based on the target driving speed of the vehicle, the accelerated driving, and the climbing driving, and may control the execution of the HEV mode in which the vehicle is driven using the power of the motor 144 and the engine 142.

The controller 130 may control the operation of a motor in the actuator 147a to control the closing of the clutch 147, and control a pressure of a fluid supplied to the clutch 147 to open and close the clutch 147 so that the driving in the EV mode and the HEV mode can be performed.

When the clutch 147 is a normally closed type, the configuration of the controller 130 of the embodiment will be described.

When the driving mode is the EV mode, the controller 130 may control the clutch 147 to be open and control the rotational speed of the motor 144 based on the target driving speed.

The controller 130 may control the switching of the inverter 146 when controlling the rotation speed of the motor 144.

When the driving mode is the HEV mode, the controller 130 may control the clutch 147 to the closed state and controls the rotational speed of the engine 142 and the rotational speed of the motor 144 based on the target driving speed.

When the driving mode is the HEV mode, the controller 130 may control the operation of the generator 145 to start the engine 142 and control the driving of the engine 142.

The controller 130 may communicate with the battery management apparatus 160 while driving in the HEV mode, and receive the state information of the battery 143 from the battery management apparatus 160.

Here, the state information of the battery 143 may include charging state information of the battery 143 and abnormal state information of the battery 143. The SOC of the battery 143 may include an amount of charge of the battery 143.

The state information of the battery 143 may include the SOC of the battery 143 and a voltage value of the battery 143, and may further include at least one of power limit values of the battery 143.

Here, the power limit value of the battery 143 may be power available through the battery 143 when the power required by the user is constant during discharge of the battery 143 or when a reference power is preset.

While driving in the EV mode, the controller 130 may determine whether to switch to the HEV mode based on the power limit value of the battery 143 and the target driving speed, and when it is determined that the controller 130 needs to switch to the HEV mode is performed, the controller 130 may control the closing of the clutch 147 installed between the engine 142 and the motor 144 and limit the output of the motor 144 based on the limit power value of the battery 143 when the battery 143 is discharged.

The controller 130 may control the operation of the generator 145 based on the SOC of the battery 143 and the temperature of the battery 143 while driving in the EV mode or the HEV mode so that the engine 142 is operated, and may charge the battery 143 by causing the generator 145 to perform a function as the generator 145 by the operation of the engine 142.

The controller 130 may receive information on a current output available time of the battery 143 from the battery management apparatus 160 and control the operation of the power system 140 and the electronic devices based on the received information about the current output available time of the battery 143.

The engine 142 may transmit the generated power to the wheels 141 and the generator 145 when the clutch 147 is in the closed state.

The generator 145 may charge the battery 143 while starting the engine 142 based on the control command of the controller 130 or performing the function as a generator by the power of the engine 142.

The inverter 146 may convert DC power supplied from the battery 143 into three-phase AC power based on the control command of the controller 130 and apply the converted AC power to the motor 144.

The actuator 147a may move oil to the clutch 147 through driving of a motor provided therein to generate hydraulic pressure in the clutch 147. At this time, the clutch 147 may be opened while a spring in the clutch 147 is pushed by the hydraulic pressure generated therein.

The controller 130 according to an exemplary embodiment of the present disclosure may include a non-transitory memory storing an algorithm to control operation of the components in the vehicle or data about a program that implements the algorithm, and a processor carrying out the aforementioned operation using the data stored in the memory. The memory and the processor may be implemented in separate chips. Alternatively, the memory and the processor may be implemented in a single chip.

The controller 130 may be an electronic control unit (ECU) that controls the driving of the vehicle, and may be any one of a microcomputer, a CPU, and a processor.

Referring to FIG. 3, the battery management apparatus 160 may include a temperature detector 161, a voltage detector 162, a management controller 163, a storage 164 and a communicator 165, and may further include a current detector 166.

The temperature detector 161 (e.g., a temperature sensor, etc.) may detect the temperature of the battery 143 and output temperature information about the detected temperature.

The voltage detector 162 (e.g., a voltage sensor, etc.) may detect the voltage of the battery 143 and output voltage information about the detected temperature.

There may be a plurality of voltage detectors 162. The plurality of voltage detectors 162 are connected to output terminals of the plurality of cells of the battery 143 to detect voltages of the plurality of cells, respectively.

The battery management apparatus 160 may further include a switch connected to the voltage detector 162. The switch may be selectively connected to the plurality of cells. The voltage detector 162 may detect voltages of the plurality of cells, respectively, and output voltage information about voltages of each of the detected cells in response to a change in an on contact of the switch.

The battery management apparatus 160 may further include the current detector 166 that detects a current of the battery 143 and outputs current information about the detected current.

The management controller 163 may obtain the charging state information of the battery 143 based on the detected current information and voltage information of the battery 143, and output the obtained charging state information of the battery 143 to the controller 130.

Here, the charging state information of the battery 143 may be the amount of charge of the battery 143 or a charge level of the battery 143.

The management controller 163 may obtain voltage values of the plurality of cells, respectively, based on the received voltage information of the plurality of cells, identify a maximum voltage value and a minimum voltage value among the obtained voltage values of the plurality of cells, obtain a voltage deviation value by subtracting the minimum voltage value from the maximum value, and compare the obtained voltage deviation value with a first reference value.

When it is determined that the obtained voltage deviation value exceeds the first reference value, the management controller 163 may obtain the power limit value based on a first map stored in the storage 164.

When obtaining a power limit value ($P_{delta}$) based on the first map stored in the storage 164, the management controller 163 may obtain a final power limit value based on the power limit value ($P_{delta}$) and a weight (Factor).

Final power limit value=weight (Factor)*power limit value ($P_{delta}$)

An initial value of the weight may be 1.

When limiting the output of the motor 144 based on the obtained final power limit value, the management controller 163 may obtain the voltage values of the plurality of cells based on the received voltage information of the plurality of cells again, identify the minimum voltage value among the obtained voltage values of the plurality of cells, compare the identified minimum voltage value and a second reference value. As a result of comparing the minimum voltage value and the second reference value, the management controller 163 may determine whether the minimum voltage value is less than the second reference value.

The management controller 163 may update the weight when it is determined that the minimum voltage value is less than the second reference value, and initialize the weight when it is determined that the minimum voltage value is greater than or equal to the second reference value.

Updating the weight may include obtaining the weight based on a weight table stored in the storage 164 and updating a current weight with the obtained weight.

The management controller 163 may update the current weight to obtain the power limit value later.

Initializing the weight may include setting the weight to 1.

When it is determined that the obtained voltage deviation value is less than or equal to the first reference value, the management controller 163 may identify a deterioration rate of the battery 143 and compare the identified deterioration rate with a reference deterioration rate.

The degradation of the battery 143 may include capacity degradation and internal resistance degradation.

An identified deterioration rate of the battery 143 may be a deterioration rate corresponding to a period of use of the battery 143. In this case, the storage 164 may store the deterioration rate corresponding to the period of use.

The management controller 163 may obtain the deterioration rate of the battery 143 based on the temperature and charging rate of the battery 143.

The management controller 163 may obtain the deterioration rate of the battery 143 based on the reduced capacity compared to a rated capacity of the battery 143.

When it is determined that the deterioration rate of the battery 143 exceeds the reference deterioration rate, the management controller 163 may obtain a power limit value ($P_{soh}$) based on a second map.

When obtaining the power limit value ($P_{soh}$) based on the second map stored in the storage 164, the management controller 163 may obtain the final power limit value based on the power limit value ($P_{soh}$) and the weight (Factor).

Final power limit value=weight (Factor)*power limit value ($P_{soh}$)

The initial value of the weight may be 1.

When it is determined that the deterioration rate of the battery 143 is less than or equal to the reference deterioration rate, the management controller 163 may determine that the battery is in a normal state, and obtain a power limit value ($P_{normal}$) corresponding to the normal state based on a third map.

When obtaining the power limit value ($P_{normal}$) corresponding to the normal state, the management controller 163 may obtain the final power limit value based on the power limit value ($P_{normal}$) and the weight (Factor) corresponding to the normal state.

Final power limit value=weight (Factor)*power limit value ($P_{normal}$)

The initial value of the weight may be 1.

The management controller 163 may limit the output of the motor 144 based on the obtained final power limit value.

The management controller 163 may determine the power limit value based on the voltage deviation between cells and the deterioration rate of the battery 143, and the management controller 163 may transmit the power limit value to the controller 130.

The management controller 163 may identify the voltage information about the voltage of the battery 143 detected while performing the EV mode, determine whether the voltage value of the battery 143 is less than the second reference value based on the identified voltage information. When it is determined that the voltage value of the battery 143 is less than the second reference value, the management controller 163 may update the weight to prevent battery damage.

The management controller 163 may identify the minimum voltage value among voltage values of the plurality of cells. When the second reference value is less than the minimum voltage value, the management controller 163 may obtain the minimum voltage value from the second reference value to obtain a subtraction value. When it is determined that the obtained subtraction value exceeds a third reference value, the management controller 163 may obtain a final weight by subtracting a first predetermined ratio of a set value from the current weight, and update the current weight to the obtained final weight.

When it is determined that the obtained subtraction value is less than or equal to the third reference value, the management controller 163 may obtain the final weight by subtracting a second predetermined ratio of the set value from the current weight, and update the current weight with the obtained final weight.

Here, the ratio of changing the set value may vary according to the obtained subtraction value.

The management controller 163 may identify an output reduction time of the battery 143 corresponding to the current deterioration rate of the battery 143. When the deterioration rate of the battery 143 exceeds the reference deterioration rate, the management controller 163 may obtain the current output available time of the battery 143 based on a previously stored reference output available time of battery 143 and the output reduction time of the battery 143, and transmit information about the obtained current output available time of the battery 143 to the controller 130.

The storage 164 may store information about the output reduction time of the battery 143 corresponding to the deterioration rate of the battery 143 and the reference output available time of the battery 143.

The storage 164 may store information about the first reference value, the second reference value, the third reference value, and the reference deterioration rate.

The storage 164 may store the first map in which the power limit value corresponding to a voltage difference between the maximum voltage value and the minimum voltage value is matched.

The storage 164 may store the second map in which the power limit value corresponding to the deterioration rate of the battery 143 is matched.

The storage 164 may stores a third map in which power limit values corresponding to voltage values of the battery 143 are matched when the battery 143 is in the normal state. Here, the voltage values of the battery 143 matched to the third map may be any one of an average voltage value, the minimum voltage value, and the maximum voltage value of the plurality of cells.

The storage 164 may store the deterioration rate corresponding to the period of use.

The storage 164 may store the output reduction time corresponding to the deterioration rate of the battery 143 as a table.

The storage 164 may store the table in which the amount of charge of the battery 143 is matched corresponding to the correlation between the current, voltage, and temperature of the battery 143.

The storage 164 may be a memory implemented with a chip separate from the aforementioned processor in relation to the management controller 163, or may be implemented integrally with the processor in a single chip.

The storage 164 may be implemented with at least one of a non-volatile memory device, such as cache, read only memory (ROM), programmable ROM (PROM), erasable programmable ROM (EPROM), electrically erasable programmable ROM (EEPROM), a volatile memory device, such as random access memory (RAM), or a storage medium, such as a hard disk drive (HDD) or a compact disk (CD) ROM, without being limited thereto.

The communicator 165 may communicate with the controller 130 and transmit state information of the battery 143 to the controller 130.

The communicator 165 may include at least one communication module configured to communicate with the controller 130. The communication module may be a hardware device implemented by various electronic circuits, e.g., processor, to transmit and receive signals via wireless or wired connections. For example, the communicator 165 may include at least one of a short-range communication module, a wired communication module, and a wireless communication module.

The short-range communication module may include a variety of short range communication modules, which is configured to transmit and receive a signal using a wireless communication module in the short range, e.g., Bluetooth module, Infrared communication module, Radio Frequency Identification (RFID) communication module, Wireless Local Access Network (WLAN) communication module, NFC communications module, and ZigBee communication module.

The wired communication module may include a variety of wired communication module, e.g., Controller Area Network (CAN) module, Local Area Network (LAN) module, Wide Area Network (WAN) module, or Value Added Network (VAN) module and a variety of cable communication module, e.g., Universal Serial Bus (USB), High Definition Multimedia Interface (HDMI), Digital Visual Interface (DVI), recommended standard 232 (RS-232), power line communication or plain old telephone service (POTS).

The wireless communication module may include a wireless communication module supporting a variety of wireless communication methods, e.g., Wi-Fi module, Wireless broadband module, global System for Mobile (GSM) Communication, Code Division Multiple Access (CDMA), Wideband Code Division Multiple Access (WCDMA), Time Division Multiple Access (TDMA), and Long Term Evolution (LTE).

Figure 4:
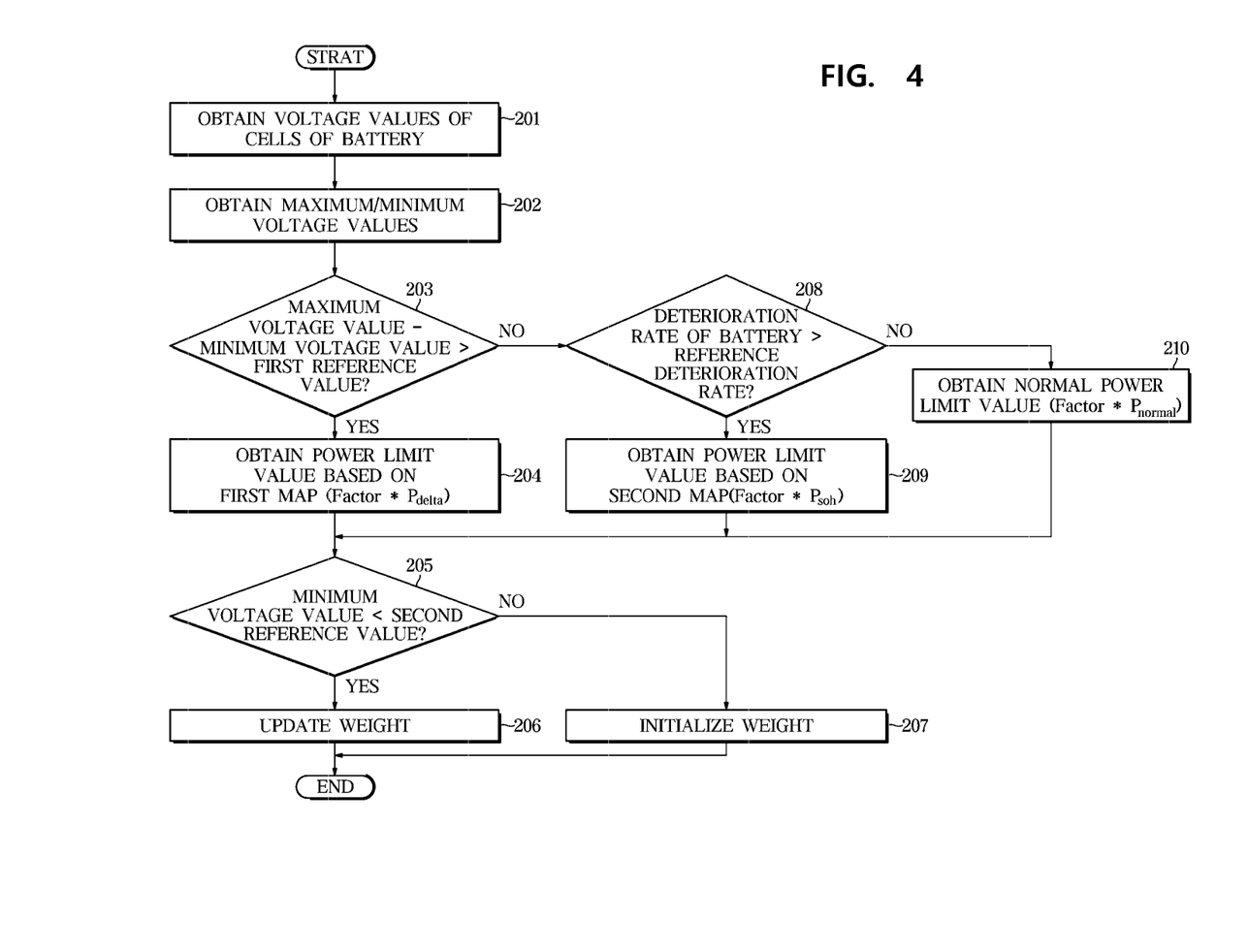
FIG. 4 is a control flowchart of a vehicle according to an exemplary embodiment of the present disclosure.

FIG. 4 is a control flowchart of a vehicle according to an exemplary embodiment of the present disclosure.

The vehicle may obtain the voltage information corresponding to voltages of cells of the battery 143 detected by the voltage detector 162 provided in the battery management apparatus 160.

The vehicle may obtain the voltage values of the plurality of cells based on the voltage information of the plurality of cells (201), and identify the maximum voltage value and the minimum voltage value among the obtained voltage values of the plurality of cells (202).

The vehicle may obtain the voltage deviation value by subtracting the minimum voltage value from the identified maximum voltage value, and compare the obtained voltage deviation value with the first reference value.

When the vehicle determines that the obtained voltage deviation value exceeds the first reference value as the result of comparing the obtained voltage deviation value and the first reference value (203), the vehicle may obtain the power limit value based on the first map stored in the storage 164 (204).

When the obtained voltage deviation value exceeds the first reference value, it means that the deterioration of the battery 143 has progressed beyond the reference value. That is, when the obtained voltage deviation value exceeds the first reference value, it means that the battery 143 is in the abnormal state.

When obtaining the power limit value ($P_{delta}$) based on the first map stored in the storage 164, the vehicle may obtain the final power limit value based on the power limit value ($P_{delta}$) and the weight (Factor).

$$\text{Final power limit value} = \text{weight (Factor)} * \text{power limit value } (P_{delta})$$

The initial value of the weight may be 1.

The vehicle may control the discharge of the battery 143 based on the obtained final voltage deviation value.

When the obtained voltage deviation value exceeds the first reference value, the vehicle may limit the output of the motor 144 based on the obtained final power limit value.

When limiting the output of the motor 144 based on the obtained final power limit value, the vehicle may obtain the voltage values of the plurality of cells based on the received voltage information of the plurality of cells again, identify the minimum voltage value among the obtained voltage values of the plurality of cells, compare the identified minimum voltage value and a second reference value. As a result of comparing the minimum voltage value and the second reference value, the vehicle may determine whether the minimum voltage value is less than the second reference value (205).

The vehicle may update the weight when it is determined that the minimum voltage value is less than the second reference value (206), and initialize the weight when it is determined that the minimum voltage value is greater than or equal to the second reference value (207).

Updating the weight may include obtaining the weight based on a weight table stored in the storage 164 and updating a current weight with the obtained weight.

The vehicle may update the current weight to obtain the power limit value later.

Initializing the weight may include setting the weight to 1.

When the vehicle determines that the obtained voltage deviation value is less than the first reference value as the result of comparing the obtained voltage deviation value with the first reference value, the vehicle may identify the deterioration rate of the battery 143 and compare the identified deterioration rate with the reference deterioration rate.

The degradation of the battery 143 may include capacity degradation and internal resistance degradation.

The identified deterioration rate of the battery 143 may be the deterioration rate corresponding to the period of use of the battery 143. In this case, the storage 164 may store the deterioration rate corresponding to the period of use.

The vehicle may obtain the deterioration rate of the battery 143 based on the temperature and charging rate of the battery 143.

The vehicle may obtain the deterioration rate of the battery 143 based on the reduced capacity compared to the rated capacity of the battery 143.

When the vehicle determines that the deterioration rate of the battery 143 exceeds the reference deterioration rate as the result of comparing the deterioration rate and the reference deterioration rate (208), the vehicle may obtain the power limit value ($P_{soh}$) based on the second map stored in the storage (209).

When the vehicle obtains the power limit value ($P_{soh}$) based on the second map stored in the storage 164, the vehicle may obtain the final power limit value based on the power limit value ($P_{soh}$) and the weight (Factor).

$$\text{Final power limit value} = \text{weight (Factor)} * \text{power limit value } (P_{soh})$$

The initial value of the weight may be 1.

When the deterioration rate of the battery 143 exceeds the reference deterioration rate, the vehicle may limit the output of the motor 144 based on the obtained final power limit value.

When the battery 143 deteriorates, the power limit value that the battery 143 can use also changes.

Accordingly, the vehicle may obtain the deterioration rate of the battery 143 and uses it to obtain the power limit value of the battery 143 based on the obtained deterioration rate.

Even if the battery 143 deteriorates, the output of the battery 143 may maintain a reference output performance. However, the time during which the reference output performance of the battery 143 is maintained may vary.

For example, in a case of the battery 143 whose deterioration rate is less than or equal to the reference deterioration rate, the 30 kW output performance may be maintained for 10 hours. On the other hand, the battery 143 whose the deterioration rate exceeds the reference deterioration rate may maintain the 30 kW output performance for 5 hours.

The vehicle may obtain the information about the time for maintaining the reference output performance of the battery 143 based on the deterioration rate of the battery 143, and control charging and discharging of the battery 143 based on the obtained time information.

When the deterioration rate of the battery 143 exceeds the reference deterioration rate, the vehicle may obtain the current output available time of the battery 143 based on the reference output available time of the battery 143 and the current deterioration rate of the battery 143, and control the driving of the vehicle and the operation of the electronic devices in the vehicle based on the obtained current output available time of the battery 143.

Current output available time of battery = reference output available time of battery—output reduction time corresponding to deterioration rate Here, the output reduction time corresponding to the deterioration rate of the battery 143 may be a value obtained through a battery test and may be stored as the table.

The vehicle may control the discharge of the battery 143 based on the obtained current output available time.

When the vehicle determines that the deterioration rate of the battery 143 is less than or equal to the reference deterioration rate, the vehicle may determine that the state of the battery is the normal state, and obtain the power limit value ($P_{normal}$) corresponding to the normal state (210) based on the third map.

When the vehicle obtains the power limit value ($P_{normal}$) corresponding to the normal state, the vehicle may obtain the final power limit value based on the power limit value ($P_{normal}$) and the weight (Factor) corresponding to the normal state.

$$\text{Final power limit value} = \text{weight (Factor)} * \text{power limit value } (P_{normal})$$

The initial value of the weight may be 1.

When the battery 143 is in the normal state, the vehicle may limit the output of the motor 144 based on the obtained final power limit value.

Even when the vehicle limits the output of the motor 144 based on the final power limit value corresponding to the deterioration rate of the battery 143 and the final power limit value corresponding to the normal state of the battery 143, the vehicle may identify the voltage information of the plurality of cells again, obtain the voltage values of the plurality of cells based on the voltage information of the cells again, identify the minimum voltage value among the obtained voltage values of the plurality of cells, and compare the identified minimum voltage value with the second reference value. As the result of comparing of the identified minimum voltage value with the second reference value, the vehicle may determine whether the identified minimum voltage value is less than the second reference value (205).

Next, the vehicle may update the weight when it is determined that the identified minimum voltage value is less than the second reference value (206), and initialize the weight when it is determined that the identified minimum voltage value is greater than or equal to the second reference value.

When obtaining the deterioration rate of the battery 143, an error may be included.

Even if the voltage deviation value of the battery 143 is the same (that is, the state of the battery is in the normal state), the voltage value for the same current may be detected differently according to an internal state of the battery 143.

Therefore, in order to protect the battery 143, the vehicle may update the weight based on the minimum voltage value among the voltage values of the cells.

Figure 5:
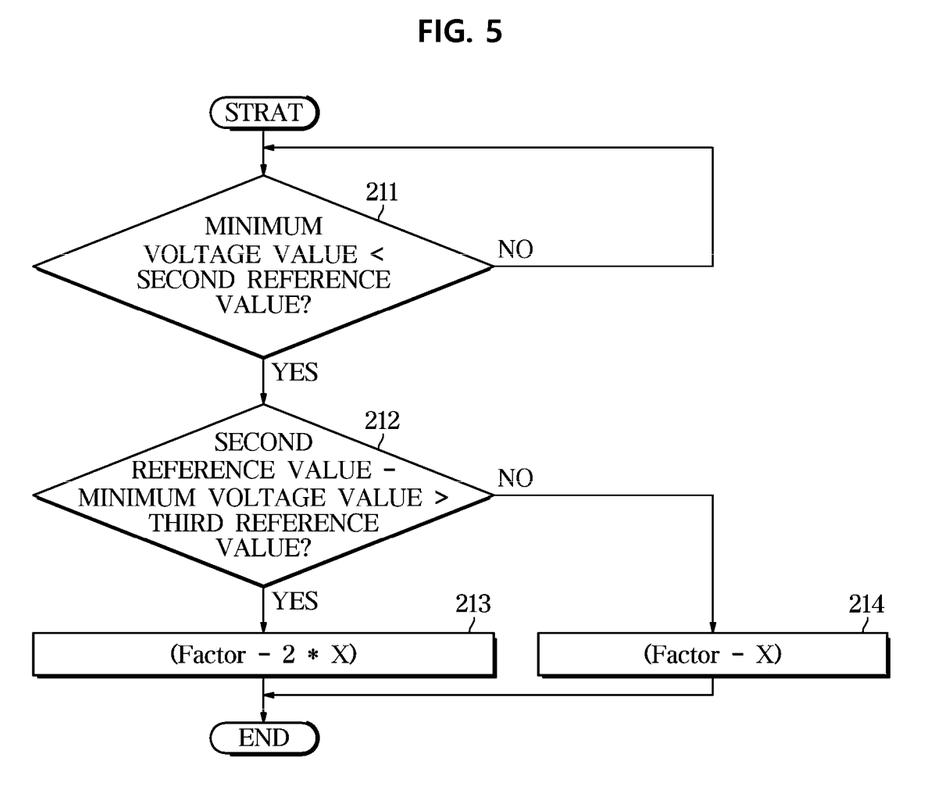
FIG. 5 is a control flowchart of updating a weight during a vehicle control according to an exemplary embodiment of the present disclosure.

FIG. 5 is a control flowchart of updating a weight during a vehicle control according to an exemplary embodiment of the present disclosure.

The vehicle may identify the voltage information of the plurality of cells again, obtain the voltage values of the plurality of cells again based on the voltage information of the plurality of cells, and identify the minimum voltage value among the obtained voltage values of the plurality of cells. When the second reference value is less than the identified minimum voltage value (211), the vehicle may obtain the subtraction value by subtracting the minimum voltage value from the second reference value.

The reason for obtaining the subtraction value by subtracting the minimum voltage value from the second reference value is to identify how much the minimum voltage value is different from the second reference value.

When the subtraction value obtained by subtracting the minimum voltage value from the second reference value is large, it means that the current power limit value is insufficient, and thus the power limit value must be increased. That is, the larger the subtraction value, the larger the power limit value should be increased.

The vehicle may compare the obtained deduction value and the third reference value, and when it is determined that the obtained deduction value exceeds the third reference value as a result of comparing the obtained deduction value and the third reference value (212), the vehicle may obtain the final weight by subtracting the first predetermined ratio of a set value A from the current weight, and update the current weight the obtained final weight (213).

Here, the first predetermined ratio may be a double ratio.

Final weight=current weight (Factor)−2*A

As the result of comparing the obtained subtraction value with the third reference value, if the vehicle determines that the obtained subtraction value is less than or equal to the third reference value, the vehicle obtains the final weight by subtracting the second predetermined ratio of the set value (A) from the current weight. The current weight is updated with the obtained final weight (214).

Here, the first predetermined ratio may be a ratio of 1 times.

Final Weight=Current Weight (Factor)−1*A

Figure 6:
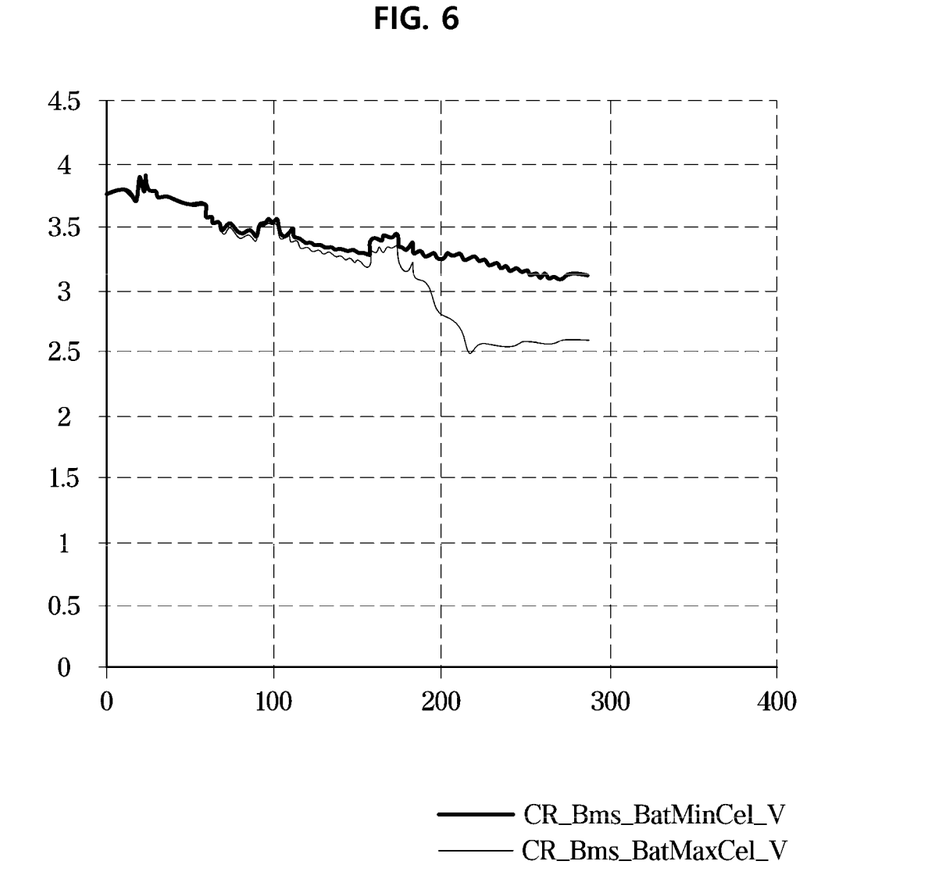
FIG. 6 is a graph of a voltage value corresponding to a usage time of a battery of a vehicle according to an exemplary embodiment of the present disclosure.

As illustrated in FIG. 6, the power limit value of the battery 143 may be obtained based on the voltage deviation value of the plurality of cells and the deterioration rate of the battery 143. By supplying power to the power system 140 of the vehicle and the electronic devices of the vehicle based on the obtained power limit value of the battery 143, it can be identified that the minimum voltage value of the cells of the battery 143 is maintained above 2.5V, which is al minimum available voltage value of a conventional battery.

In this way, it is possible to prevent the battery 143 from being over-discharged below the minimum available voltage value and shortening a life.

According to an exemplary embodiment of the disclosure, the power limit value of the battery may be obtained in consideration of deterioration of the battery, and a usage time of the battery may be adjusted.

According to an exemplary embodiment of the disclosure, even if the battery is deteriorated, the power may be output in a normal battery voltage use area, and thus, the vehicle may be stably controlled.

According to an exemplary embodiment of the disclosure, it is possible to prevent battery deterioration from accelerating by preventing the voltage of the battery from exceeding the normal voltage range.

According to an exemplary embodiment of the disclosure, by adjusting the power limit value based on a voltage deviation value and the weight of the plurality of cells, it is possible to prevent the battery from over-discharging below an available minimum voltage value and shortening the life.

As described above, the disclosure may prevent damage of the battery due to the low voltage of the battery, and may improve a marketability of a Hybrid Electric Vehicle (HEV) and a Plug-in Hybrid Electric Vehicle (PHEV) that can be driven by the battery and the motor, further increase user satisfaction, and secure product competitiveness.

The disclosed embodiments may be implemented in the form of a recording medium storing computer-executable instructions that are executable by a processor. The instructions may be stored in the form of a program code, and when executed by a processor, the instructions may generate a program module to perform operations of the disclosed embodiments. The recording medium may be implemented non-transitory as a computer-readable recording medium.

The non-transitory computer-readable recording medium may include all kinds of recording media storing commands that can be interpreted by a computer. For example, the non-transitory computer-readable recording medium may be, for example, ROM, RAM, a magnetic tape, a magnetic disc, flash memory, an optical data storage device, etc.

Embodiments of the disclosure have thus far been described with reference to the accompanying drawings. It should be obvious to a person of ordinary skill in the art that the disclosure may be practiced in other forms than the embodiments as described above without changing the technical idea or essential features of the disclosure. The above embodiments are only by way of example, and should not be interpreted in a limited sense.

What is claimed is:

1. A battery management apparatus comprising:
a battery having a plurality of cells;
a voltage detector configured to detect respective voltage values of the plurality of cells and to output voltage information about the detected voltage values;
a storage configured to store a first map in which power limit values corresponding to voltage deviation values are matched; and
a management controller configured to:
identify a maximum voltage value and a minimum voltage value among the voltage values of the plurality of cells,
obtain a voltage deviation value between the maximum voltage value and the minimum voltage value,
obtain a first power limit value of the battery corresponding to the voltage deviation value based on the first map, and
control discharging of the battery based on the first power limit value of the battery.

2. The battery management apparatus according to claim 1, further comprising:
a communicator configured to transmit the first power limit value of the battery to a vehicle controller in response to a control command of the management controller.

3. The battery management apparatus according to claim 1, wherein, when the voltage deviation value exceeds a first reference value, the management controller is further configured to obtain a first final power limit value based on the first power limit value of the battery and a preset weight.

4. The battery management apparatus according to claim 3, wherein, when controlling the discharge of the battery based on the first final power limit value, the management controller is further configured to:
identify the minimum voltage value among the voltage values of the plurality of cells, and
update the preset weight when the minimum voltage value is less than a second reference value.

5. The battery management apparatus according to claim 4, wherein, when updating the preset weight, the management controller is further configured to:
update the preset weight based on a set value and a first predetermined ratio when the minimum voltage value is less than the second reference value and a value obtained by subtracting the second reference value from the minimum voltage value exceeds a third reference value, and
update the preset weight based on the set value and a second predetermined ratio when the subtracted value is less than or equal to the third reference value.

6. The battery management apparatus according to claim 1, wherein:
the storage is further configured to store a second map in which power limit values respectively corresponding to deterioration rates of the battery are matched; and
the management controller is further configured to:
obtain a deterioration rate of the battery when the voltage deviation value is less than or equal to a first reference value,
obtain a second power limit value corresponding to the deterioration rate of the battery based on the second map when the deterioration rate of the battery exceeds a reference deterioration rate, and
obtain a second final power limit value based on the second power limit value and a preset weight.

7. The battery management apparatus according to claim 6, wherein, when controlling the discharge of the battery based on the second final power limit value, the management controller is further configured to:
identify the minimum voltage value among the voltage values of the plurality of cells, and
update the preset weight when the minimum voltage value is less than a second reference value.

8. The battery management apparatus according to claim 7, wherein, when updating the preset weight, the management controller is further configured to:
update the preset weight based on a set value and a first predetermined ratio when the minimum voltage value is less than the second reference value and a value obtained by subtracting the second reference value from the minimum voltage value exceeds a third reference value, and
update the preset weight based on the set value and a second predetermined ratio when the subtracted value is less than or equal to the third reference value.

9. The battery management apparatus according to claim 6, wherein:
the storage is further configured to store a third map in which power limit values respectively corresponding to the voltage values of the battery are matched; and
when the voltage deviation value is less than or equal to the first reference value and the deterioration rate of the battery is less than or equal to the reference deterioration rate, which is determined to be a normal state of the battery, the management controller is further configured to:
obtain a third power limit value corresponding to the normal state of the battery based on the third map and
obtain a third final power limit value based on the third power limit value and the preset weight.

10. The battery management apparatus according to claim 9, wherein, when controlling the discharge of the battery based on the third final power limit value, the management controller is further configured to:
identify the minimum voltage value among the voltage values of the plurality of cells, and
update the preset weight when the identified minimum voltage value is less than a second reference value.

11. The battery management apparatus according to claim 10, wherein, when updating the preset weight, the management controller is further configured to:
update the preset weight based on a set value and a first predetermined ratio when the minimum voltage value is less than the second reference value and a value obtained by subtracting the second reference value from the minimum voltage value exceeds a third reference value, and
update the preset weight based on the set value and a second predetermined ratio when the subtracted value is less than or equal to the third reference value.

12. The battery management apparatus according to claim 6, wherein, when the deterioration rate of the battery exceeds the reference deterioration rate, the management controller is further configured to:
obtain an output reduction time corresponding to the deterioration rate of the battery,
obtain a current output available time of the battery based on a reference output available time and the output reduction time, and control the discharge of the battery based on the current output available time.

13. A vehicle comprising:
wheels using at least one of power of a motor and an engine as a driving power;
a battery having a plurality of cells and configured to supply power to the motor;
a voltage detector configured to detect respective voltage values of the plurality of cells and to output voltage information about the detected voltage values;
a storage configured to store a first map in which power limit values corresponding to voltage deviation values are matched;
a battery management apparatus including a processor configured to
identify a maximum voltage value and a minimum voltage value among the voltage values of the plurality of cells,
obtain a voltage deviation value between the maximum voltage value and the minimum voltage value and a first power limit value of the battery corresponding to the voltage deviation value based on the first map, and
obtain a first final power limit value based on the first power limit value of the battery and a preset weight when the voltage deviation value exceeds a first reference value; and
a controller configured to control an operation of at least one of the motor, the battery, or the engine, and to control discharge of the battery based on the first final power limit value obtained from the battery management apparatus.

14. The vehicle according to claim 13, wherein:
the storage is further configured to store a second map in which power limit values respectively corresponding to deterioration rates of the battery are matched; and
the processor of battery management apparatus is further configured to:
obtain a deterioration rate of the battery when the voltage deviation value is less than or equal to a first reference value,
obtain a second power limit value corresponding to the deterioration rate of the battery based on the second map when the deterioration rate of the battery exceeds a reference deterioration rate, and
obtain a second final power limit value based on the second power limit value and the preset weight.

15. The vehicle according to claim 14, wherein:
the storage is further configured to store a third map in which power limit values respectively corresponding to the voltage values of the battery are matched; and
when the voltage deviation value is less than or equal to the first reference value and the deterioration rate of the battery is less than or equal to the reference deterioration rate, which is determined to be a normal state of the battery, the processor of battery management apparatus is further configured to:
obtain a third power limit value corresponding to the normal state of the battery based on the third map, and
obtain a third final power limit value based on the third power limit value and the preset weight.

16. The vehicle according to claim 15, wherein, when controlling the discharge of the battery, the processor of battery management apparatus is further configured to:
identify the minimum voltage value among the voltage values of the plurality of cells, and
update the preset weight when the identified minimum voltage value is less than a second reference value.

17. The vehicle according to claim 16, wherein, when updating the preset weight, the processor of battery management apparatus is further configured to:
update the preset weight based on a set value and a first predetermined ratio when the minimum voltage value is less than the second reference value and a value obtained by subtracting the second reference value from the minimum voltage value exceeds a third reference value, and
update the preset weight based on the set value and a second predetermined ratio when the subtracted value is less than or equal to the third reference value.

18. The vehicle according to claim 14, wherein, when the deterioration rate of the battery exceeds the reference deterioration rate, the processor of battery management apparatus is further configured to obtain an output reduction time corresponding to the deterioration rate of the battery, to obtain a current output available time of the battery based on a reference output available time and the output reduction time, and to transmit the current output available time to the controller.

19. A method of controlling a vehicle, the vehicle including a motor, an engine, and a battery, the method comprising:
detecting respective voltage values of the plurality of cells provided in the battery;
identifying a maximum voltage value and a minimum voltage value among the voltage values of the plurality of cells;
obtaining a voltage deviation value between the maximum voltage value and the minimum voltage value;
obtaining a deterioration rate of the battery;
obtaining a power limit value of the battery based on at least one of the voltage deviation value or the deterioration rate of the battery;
obtaining a final power limit value based on the power limit value and a preset weight; and
controlling a discharge of the battery based on the final power limit value.

20. The method according to claim 19, wherein the obtaining of the power limit value of the battery comprises:
when the voltage deviation value exceeds a first reference value, obtaining the power limit value based on a first map in which power limit values corresponding to voltage deviation values are matched;
when the voltage deviation value is less than or equal to the first reference value and the deterioration rate of the battery exceeds a reference deterioration rate, obtaining the power limit value based on a second map in which power limit values respectively corresponding to deterioration rates of the battery are matched; and
when the voltage deviation value is less than or equal to the first reference value and the deterioration rate of the battery is less than or equal to the reference deterioration rate, obtaining the power limit value based on a third map in which power limit values respectively corresponding to the voltage values of the battery are matched.

21. The method according to claim 15, further comprising:
when controlling the discharge of the battery, identifying the minimum voltage value among the voltage values of the plurality of cells, and updating the preset weight when the identified minimum voltage value is less than the second reference value.

\* \* \* \* \*